United States Patent [19]

Stern

[11] 4,362,957
[45] Dec. 7, 1982

[54] CLOCK PULSE TOLERANCE VERIFICATION CIRCUIT

[75] Inventor: David R. Stern, Hinsdale, Ill.

[73] Assignee: GTE Automatic Electric Labs Inc., Northlake, Ill.

[21] Appl. No.: 220,670

[22] Filed: Dec. 29, 1980

[51] Int. Cl.³ .......................................... H03K 13/32
[52] U.S. Cl. .................................. 307/527; 307/480; 328/163; 371/25; 371/61
[58] Field of Search ................. 307/527, 269, 480; 371/25, 61; 328/162, 163, 164, 63

[56] References Cited

U.S. PATENT DOCUMENTS 2,980,858  4/1961  Grondin et al. .............. 307/527 X
3,237,157  2/1966  Higby ........................... 371/25 X
3,723,868  3/1973  Foster .......................... 371/25 X
4,122,995  10/1978  Franke ......................... 371/25 X Primary Examiner—John S. Heyman
Attorney, Agent, or Firm—Robert J. Black; Charles A. Doktycz

[57] ABSTRACT

A circuit arrangement for comparing a clock pulse train against a standard pulse train. The circuit includes an exclusive OR gate to which are inputted the pulse train to be tested, and a latch at the output of the gate, operated only upon a mismatch of the two pulse trains. Provision is also made to prevent operation of the latch within certain adjustable tolerance parameters as to pulse width and position of the pulse train.

4 Claims, 2 Drawing Figures

CLOCK PULSE TOLERANCE VERIFICATION CIRCUIT

BACKGROUND OF THE INVENTION (1) Field of the Invention

The present invention relates generally to the field of digital electronics and communications and more particularly to a clock pulse testing system for a communication switching system in which the initiation time and termination time of each constituent pulse must be checked to determine whether it falls within acceptable parameters.

(2) Description of the Prior Art

In many electronic systems, the operation of various units is controlled by sequences of timing or clock pulses provided by a special pulse generator. These timing pulses are used, for example, to insure that the various constituent units of the system are properly synchronized and operate at preselected times. In large high speed systems the problem of maintaining precise timing relationships is complicated by the large distribution system and by the variations in component delay characteristics. These factors frequently result in pulse width and/or edge distortion of the leading and trailing edges. To prevent such undesirable results effecting a system, it is desirable that a means be available to the maintenance personnel that could readily indicate the condition of the pulses at the various constituent unit locations. It has been the general practice to observe these pulse trains on an oscilloscope while checking the inputs to particular circuit components of the system.

SUMMARY OF THE INVENTION

Accordingly, it is an object of the present invention to provide a simple circuit for testing the pulse trains used in a communication system.

In the present invention, the pulses to be tested are compared to a standard repetitive clock pulse train. If the two pulses to within the preset tolerance, the error latch is not set. If, however, the two trains of pulses miscompare by more than an allowed tolerance, the error latch is set indicating a miscomparison.

The circuit essentially consists of an exclusive OR gate. This gate compares the two pulse trains and outputs a logic "1" in series with the output of the exclusive OR gate there is a miscomparison. To prevent the setting of the error latch when the pulse train under test is different but within acceptable tolerances, a window pulse is applied to two input NAND gates to inhibit the setting of the latch, if the miscomparison falls within the period of these pulses.

BRIEF DESCRIPTION OF THE DRAWINGS

The invention is described in detail below with reference to the accompanying drawings, wherein.

DESCRIPTION OF THE PREFERRED EMBODIMENT

Figure 1:
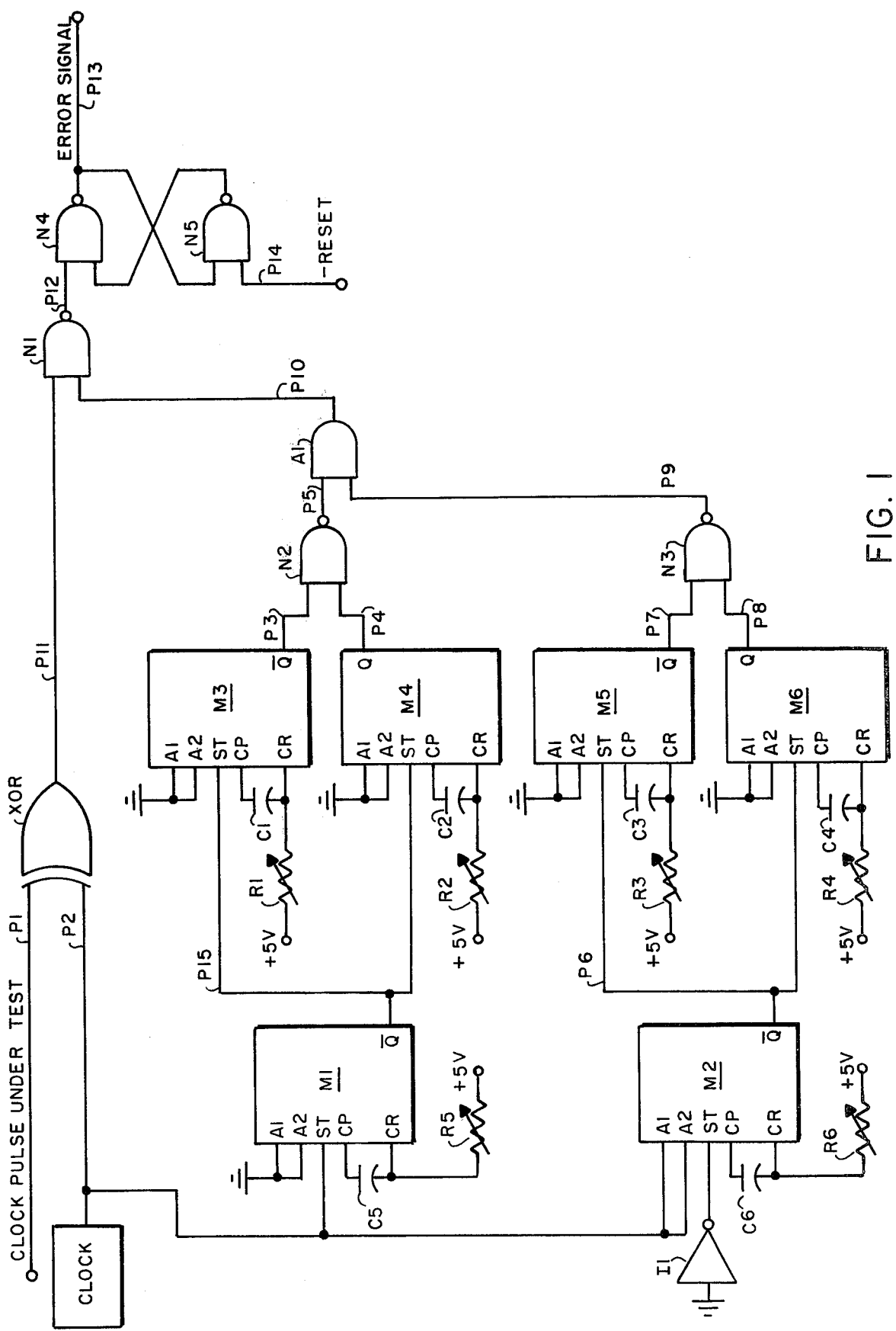
FIG. 1 is a schematic of the circuit of a preferred form of the invention.

The basic function of the clock compare circuit shown in FIG. 1 is to compare a repetitive pulse train against a standard repetitive pulse train. If the two sets of pulses compare within preset limits no error signal is produced. If, however, the two pulses miscompare by more than the permissable tolerance, an error latch is set outputting an error signal.

The standard clock SCI and the clock pulse train under test are both connected as inputs P2 and P1 respectively to an exclusive OR gate XOR. This gate XOR compares the pulses and outputs a logic "1" if there is a miscomparison. As an indicator of perfect comparison this gate alone would be sufficient. But to inhibit outputting an error signal under conditions where the two pulse trains miscompare yet the pulse train under test is acceptable, a NAND gate N1 is wired into the output path from the exclusive OR gate XOR to the input of latch NAND gate N4. The input to NAND gate N4 is a logic "1" whenever there is any slight miscomparison. To prevent the results of this signal passing on, a second input P10 is provided to block gate N4 for the duration of this tolerance limits. This signal P10 is generated from the standard clock signal P2. The standard clock signal P2 is input to a pair of monostable multivibrators M1 and M2. Multivibrator M1 is triggered on the rising edge of the standard clock pulse. An adjustable resistor R5 and a capacitor C5 are selected such that the Q output has a rising edge occurring a fixed interval of time before the falling edge of the standard clock pulse. Monostable M2 is similarily set so that the rising edge of output Q occurs a second fixed interval of time before the rising edge of the standard clock pulse. Monostables M1 and M2 provide triggering edges to two tolerance window generating circuits including monostables M3 and M4 for the first and M5 and M6 for the second. These monostables in the window generating circuit generate the narrow accurately adjusted tolerance limits.

Figure 2:
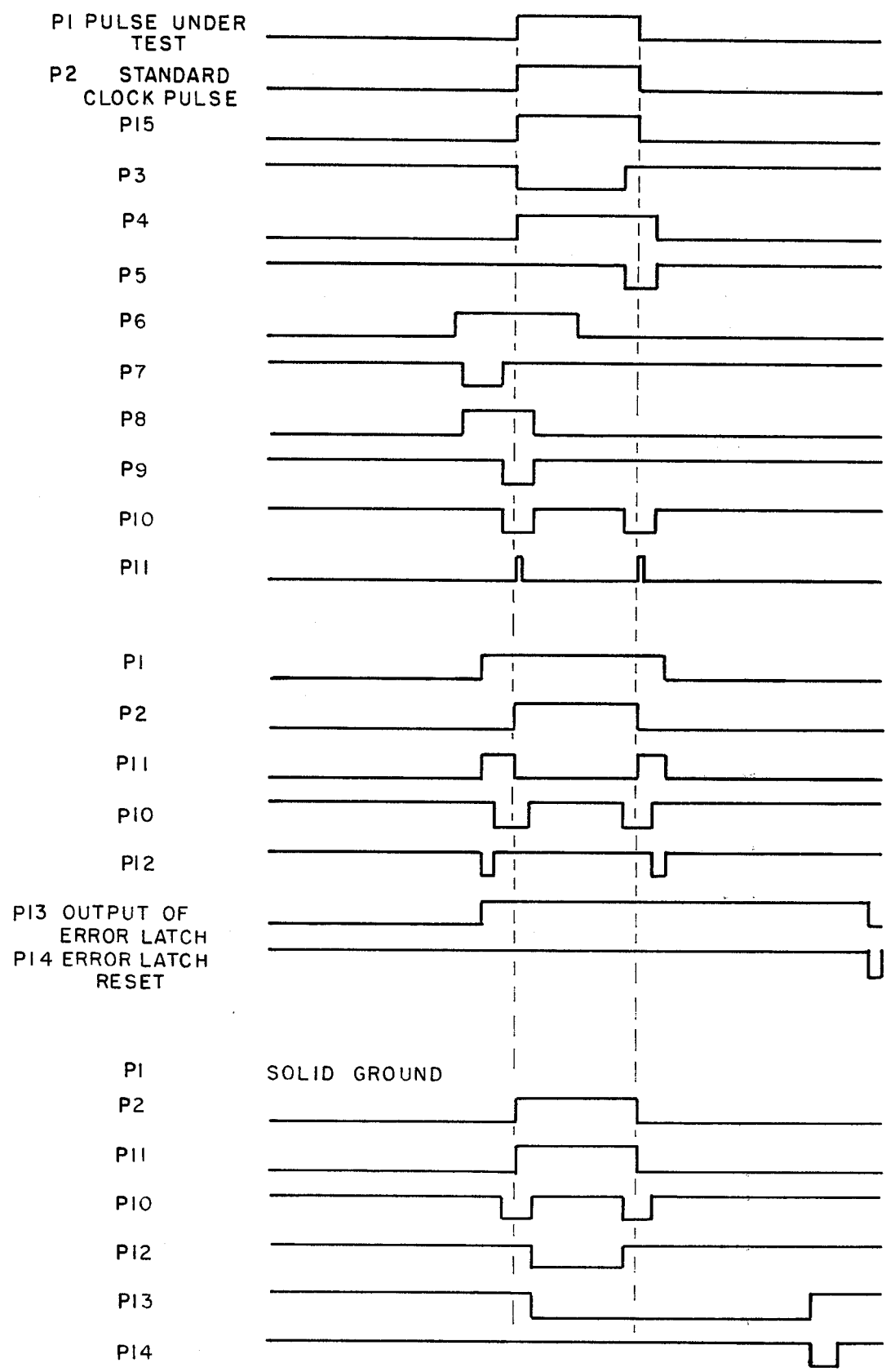
FIG. 2 is a timing chart showing the various time relationships between the clock pulses and the pulse outputs within the circuit.

The monostables M3 and M4 are triggered by an edge of the output pulse from M1. Monostable M3 generate the leading edge and monostable M4 generates the trailing edge of the tolerance window when input to NAND gate N2. Similarly, monostables M5 and M6 are triggered by an edge of the output pulse from M2. Monostable M5 generates the leading edge and monostable M6 the trailing edge of the second tolerance window when inputted to NAND gate N3. The output of NAND gates N2 and N3 are then input to AND gate A1 to result in the blocking signal P10 to NAND gate N1. The exact timing of this beginning and end of each of the tolerance windows is adjustable through the use of the resistors R1 through R4 and capacitors C1 through C4. Thus each edge of window pulse is individually adjustable. The waveforms of the pulses at the outputs of the various gates are shown on FIG. 2.

While there has been shown and described what is considered a preferred embodiment of the present invention it will be obvious to those skilled in the art that various changes and modifications may be made therein without departing from the invention as defined in the appended claims.

What is claimed is:

1. A system for verifying the presence synchronization and correct tolerance of a pulse train comprising:
    a source of standard pulses,
    an exclusive OR gate to which are inputted the pulse train to be tested and said standard pulses and having an output,
    a first and a second pulse generating means operated in response to said standard pulses to output a first tolerance pulse at an acceptable time ahead of the desired start time for a pulse of said tested pulse train and a second tolerance pulse at an acceptable time ahead of the desired termination for a pulse of said tested pulse train, a NAND gate having inputs connected to said exclusive OR gate output, and said first and second pulse generating means, and an error latch having as an input the output of said NAND gate whereby said latch is inhibited from operation during the presence of said tolerance pulses.

2. A system as claimed in claim 1, wherein said pulse generating means comprises a first monostable operated in response to a standard pulse to output a first delayed pulse, NAND gate and a second and third monostable operated in response to said first delayed pulse to control said NAND gate to output a first tolerance window pulse.

3. A system as claimed in claim 2, wherein said pulse generating means comprises a fourth monostable operated in response to said standard pulse to output a second delayed pulse, a second NAND gate and a fourth and fifth monostable operated in response to said second delayed pulse to control said second NAND gate to output a second tolerance window pulse.

4. A system as claimed in claim 2 or 3, wherein each of said monostables include a capacitor and an adjustable resistor to control their operate rates.

* * * * *